(12) United States Patent
Hofmann et al.

(10) Patent No.: US 6,475,866 B2
(45) Date of Patent: Nov. 5, 2002

(54) METHOD FOR PRODUCTION OF A MEMORY CELL ARRANGEMENT

(75) Inventors: Franz Hofmann, München (DE); Wolfgang Krautschneider, Hohenthann (DE); Josef Willer, Riemerling (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/774,316

(22) Filed: Jan. 31, 2001

(65) Prior Publication Data

US 2001/0002718 A1 Jun. 7, 2001

Related U.S. Application Data

(62) Division of application No. 09/180,129, filed as application No. PCT/DE97/00720 on Apr. 9, 1997, now Pat. No. 6,265,748.

(30) Foreign Application Priority Data

May 2, 1996 (DE) .......................... 196 17 646

(51) Int. Cl.$^7$ .................. H01L 21/336; H01L 21/8234; H01L 21/8236; H01L 29/76; H01L 29/94
(52) U.S. Cl. .................. 438/270; 438/275; 438/276; 438/278; 257/331; 257/392
(58) Field of Search .................. 438/270, 275, 438/276, 278, 256; 257/331, 332, 392

(56) References Cited

U.S. PATENT DOCUMENTS

| | | | |
|---|---|---|---|
| 4,663,644 A | 5/1987 | Shimizu | |
| 5,300,804 A | 4/1994 | Arai | |
| 5,386,381 A | 1/1995 | Takizawa et al. | |
| 5,453,637 A | 9/1995 | Fong-Chun et al. | |
| 5,744,393 A | * 4/1998 | Risch et al. | 438/275 |
| 5,920,778 A | * 7/1999 | Rosner et al. | 438/270 |
| 5,973,373 A | * 10/1999 | Krautschneider et al. | 257/390 |
| 5,998,261 A | * 12/1999 | Hofmann et al. | 438/257 |
| 6,180,979 B1 | * 1/2001 | Hofmann et al. | 257/329 |
| 6,256,748 B1 | * 7/2001 | Hofmann et al. | |
| 6,281,557 B1 | * 8/2001 | Trueby et al. | |

FOREIGN PATENT DOCUMENTS

| | | |
|---|---|---|
| DE | 42 14 923 A1 | 12/1992 |
| JP | 2-41395 | 2/1995 |
| JP | 7-169859 | 7/1995 |
| JP | 2-62590 | 11/1995 |
| JP | 2-70239 | 2/1996 |
| WO | WO 96/10266 | 4/1996 |

OTHER PUBLICATIONS

Japanese Abstract, 04226071, Aug. 14, 1992.

* cited by examiner

Primary Examiner—Olik Chaudhuri
Assistant Examiner—Shrinivas H. Rao
(74) Attorney, Agent, or Firm—Schiff Hardin & Waite

(57) ABSTRACT

A method for production of a memory cell arrangement which includes vertical MOS transistors as memory cells, wherein the information is stored utilizing at least three different threshold voltage values of the transistors by multi-level programming. One threshold voltage value is realised by the thickness of the gate dielectric in the sense of a thick oxide transistor and the other threshold voltage values are realised by different channel dopings. The arrangement can be produced with as area requirement for each memory cell of 2 $F^2$ (F: minimum structure size).

7 Claims, 6 Drawing Sheets

METHOD FOR PRODUCTION OF A MEMORY CELL ARRANGEMENT

This is a divisional application of application Ser. No. 09/180,129, filed Nov. 2, 1998 now U.S. Pat. No. 6,265,748, under the provisions of 35 U.S.C. §371 from International Application PCT/DE97/00720, filed Apr. 9, 1997.

BACKGROUND OF THE INVENTION

1. Field of the Invention

The present invention relates generally to a method for producing a memory cell arrangement, and particularly to a memory cell having vertical transistors.

2. Description of the Related Art

In order to store large volumes of data, for example for DP (data processing) applications or for the digital storage of music or images, use is mainly made at present of memory systems which have mechanically movable parts such as, for example, hard disk memories, floppy disks or compact discs. The moved parts are subject to mechanical wear. Furthermore, they require a comparatively large volume and permit only slow data access. Moreover, since they are sensitive to vibrations and position and have a comparatively high power consumption for their operation, these memory systems can be used is mobile systems only to a limited extent.

In order to store relatively small volumes of data, semiconductor-based read-only memories are known. These are often realised as a planar integrated silicon circuit is which MOS transistors are used as memory cells. The transistors are selected via the gate electrode, which is connected to the word lice. The input of the MOS transistor is connected to a reference line and the output is connected to a bit line. During the read operation, it is assessed whether or not a current is flowing through the transistor. The logic values zero and one are assigned correspondingly. The storage of zero and one is effected in technical terms is that no MOS transistor is produced or no conductive connection to the bit lice is realised in memory cells is which the logic value assigned to the state "no current flow through the transistor" is stored. As an alternative, MOS transistors which have different threshold voltages due to different dopant concentrations is the channel region can be realised for the two logic values.

These semiconductor-based memories permit random access to the stored information. The electrical power required to read the informatics is distinctly less than is the case of the abovementioned memory systems having mechanically movable parts. Since no movable parts are required, mechanical wear and sensitivity to vibrations are no longer a problem here either. Semiconductor-based memories can therefore be used for mobile systems as well.

The silicon memories described generally have a planar structure. A minimum area requirement thus becomes necessary for each memory cell and is 4 $F^2$ in the most favourable case, F being the smallest structure size that can be produced with the respective technology.

A read-only memory cell arrangement whose memory cells comprise MOS transistors is disclosed in German Patent document DE 42 14 923 A1. These MOS transistors are arranged along trenches in such a way that a source region adjoins the bottom of the trench, a drain region adjoins the surface of the substrate and a channel region adjoins the side and bottom of the trench both vertically with respect to the surface of the substrate and parallel to the surface of the substrate. The surface of the channel region is provided with a gate dielectric. The gate electrode is designed as a side covering (spacer). The logic values zero and one are differentiated by different threshold voltages, which are effected by channel implantation. During the channel implantation, the implanting ions impinge on the surface of the respective trench at as angle such that implantation is deliberately effected only along one side due to shading effects of the opposite side. In this memory cell arrangement, the word lines run as spacers, along, the sides of the trenches.

Japanese Patent document JP-A 4-226071 discloses a further memory cell arrangement, which comprises vertical MOS transistors arranged on the sides of trenches as memory cells. In this case, diffusion regions which in each case form the source/drain regions of the vertical MOS transistors run on the bottom of trenches and between adjacent trenches. The word lines, which comprise the gate electrodes of the vertical MOS transistors, run perpendicularly to the trenches. The threshold voltage of the vertical MOS transistors is sat by means of angled implantation.

U.S. Pat. No. 4,663,644 discloses a memory cell arrangement whose memory cells comprise vertical MOS transistors. These vertical MOS transistors are each arranged on the aides of trenches. The word lines, which each comprise the gate electrodes of the vertical MOS transistors, are arranged is the trenches. Two word lines are arranged is each trench. The bit lines are realised as conductor tracks on the surface of the substrate. The contact between the bit lines and the respective source/drain regions which adjoin the surface of the substrate is realised via a contact hole. The source/drain regions which adjoin the bottom of the trenches are realised as a continuous doped layer and are put at the reference potential. In this memory cell arrangement, the information is stored is the form of threshold voltages, having different levels, of the MOS transistors. The different threshold voltages are realised by different dopant concentrations in the channel region of the MOS transistors. In order to form as increased dopant concentration is the channel region, a doped layer is deposited and is structured in such a way that sides in which increased dopant concentrations are to be formed remain covered by the structured dopant layer. The channel regions having as increased dopant concentration are formed by outdiffusion of the structured dopant layer.

In order to increase the effective storage density, it has furthermore been proposed (see, for example, the publication by Yasushi Kubota, Shinji Toyoyama, Yoji Kanic, Shuhei Tsuchimoto "Proposal of New Multiple-Valued Mask-ROM Design" IEICE Trans. Electron Vol. E77, p. 601, April 1994), to program a semiconductor memory arrangement having planar MOS transistors in the sense of multi-value logic. This procedure is also referred to as multi-level programming. In this case, the MOS transistors are produced in such a way that they have four different threshold voltage values depending on the stored information. Each of the threshold voltage values is then assigned two logic values, that is to say "0" and "0", "0" and "1", "1" and "0" or "1" and "1". In this way, the effective storage density rises by a factor of two since two logic values are stored is each memory call without the area of the memory cell changing as a result of this. The different threshold voltage values are realised by different channel dopings. Masked implantation is carried out for each threshold voltage value. Four additional masks are therefore necessary for multi-level programming.

SUMMARY OF THE INVENTION

The problem underlying the invention is that of specifying a semiconductor-based memory cell arrangement in which as increased storage density is achieved and which can be produced with few production steps and a high yield. Furthermore, it is intended to specify a method for the production of such a memory cell arrangement.

The present invention solves the foregoing problems by a method for the production of a memory cell arrangement, in which strip-like trenches which essentially run in parallel are formed in a main area of a substrate which comprises, at least in the region of the main area, semiconductor material which is doped by a first conductivity type, in which MOS transistors which are vertical with respect to the main area are formed on the sides of the trenches, act as memory cells and have at least three different threshold voltage values depending on the stored information, in which a first threshold voltage value is realized by the thickness of the gate dielectric and a second and a third threshold voltage value are realized by different channel dopings.

In a preferred method, strip-like, doped regions, which are doped by a second conductivity type opposite to the first, are formed on the bottom of the trenches and on the main area between adjacent trenches, in which an insulating layer is applied, in which a first mask which has first openings is produced on the insulating layer, in which the insulating layer is structured by anisotropic etching, while using the first mask, in such a way that the sides of trenches are at least partially exposed in the region of the first openings, in which the exposed sides are doped, in which a second mask which has second openings is produced on the insulating layer, in which the insulating layer is structured by anisotropic etching, while using the second mask, in such a way that the sides of trenches are at least partially exposed in the region of the second openings, as well, in which a gate dielectric is formed on the sides of the trenches, and in which word lines are formed which run transversely with respect to the trenches.

In such a method, the insulating layer may fill the trenches, and the sides of the trenches may be essentially completely exposed in the region of the first and of the second openings. The sides may be doped by angled implantation. The implantation is carried out at any angle of inclination in the range between 20° and 30° and/or −20° and −30° with respect to the normal to the main area. In one embodiment, the sides are doped by diffusion. The trenches are provided with spacers, the strip-like, doped regions are formed by implantation in which the spacers on the sides of the trenches have a masking action, the spacers are removed after the formation of the strip-like, doped regions.

In the memory cell arrangement according to the present invention, memory cells which each comprise an MOS transistor which is vertical with respect to the main area are provided in a substrate. A substrate made of monocrystalline silicon or the silicon layer of an SOI substrate is preferably used as the substrate. The vertical MOS transistors each have one of at least three threshold voltage values depending on the stored information. The memory cell arrangement is programmed in the sense of multi-value logic.

One of the different threshold voltage values is realised by virtue of the fact that the corresponding MOS transistors have a gate dielectric having a thickness differing from the other MOS transistors. The thickness of the gate dielectric is preferably greater than in the other MOS transistors, with the result that a thick oxide transistor is formed. The remaining threshold voltage values are realised by different channel dopings.

$2^n$ threshold voltages, where n>1, are preferably realised since n logic values are then stored is each memory cell.

Strip-like trenches which essentially run in parallel are preferably provided is the substrate. Strip-like doped regions, which are doped by a second conductivity type which is opposite to the first, are arranged on the bottom of the trenches and on the main area between adjacent trenches. Gate dielectrics are is each case arranged on the sides of the trenches. Word lines are provided which run transversely with respect to the trenches and comprise gate electrodes for the vertical MOS transistors is the region of the sides of the trenches. The vertical MOS transistors are in each case formed by two strip-like, doped regions adjoining the same side of one of the trenches, which doped regions act as source/drain region, the trench side arranged in between together with the gate dielectric and the part of one of the word lines arranged thereabove. The strip-like doped regions are used as bit or reference lines during operation of the memory cell arrangement.

The spacing between adjacent trenches is preferably chorea is such a way that it is essentially equal to the width of the trenches. The spacing between adjacent word lines is likewise chosen to be equal to the width of the word lines. If the width of the trenches and the width of the word lines are chorea to correspond to the minimum structure width F is the respective technology, this produces a space requirement of 2 $F^2$ for the memory cell. If the four MOS transistors have four different threshold voltage values, then two logic values, that is to say two bite, are stored is each memory cell. The space requirement per bit is then $F^2$. If a minimum structure width of F=0.4 $\mu$m is takes as a basis and if the four MOS transistors have four different threshold voltage values, then a storage density of about 6.2 bits/$\mu m^2$ is achieved in the memory cell arrangement.

In order to produce the memory cell arrangement according to the present invention, strip-like trenches which essentially run is parallel are preferably formed in a main area of a substrate. Vertical MOS transistors are formed on the sides of the trenches with respect to the main area, which transistors act as memory cells and have at least three different threshold voltage values depending on the stored information.

Strip-like, doped regions, which are doped by a second conductivity type which is opposite to the first, are preferably formed on the bottom of the trenches and on the main area between adjacent trenches. An insulating layer is subsequently applied. A first mask which is made, for example, of photoresist and has first openings is produced on the insulating layer. The insulating layer is structured using the first mask such that the sides of the trenches are at least partially exposed is the region of the first openings. The exposed sides are doped.

A second mask which is made, for example, of photoresist and has second openings is produced on the insulating layer. The insulating layer is structured using the second mask such that the sides of the trenches are at least partially exposed in the region of the second openings.

Outside the first and second openings, the sides remain covered by the structured insulating layer. The structured insulating layer acts as a thick gate dielectric is this region. A gate dielectric is formed on the sides is the region of the first and second openings.

Word lines which run transversely with respect to the trenches are subsequently formed.

The threshold voltage value is set by the doping of the exposed sides is the region of the first openings, by the doping of the substrate is the region of the second openings, and by the thickness of the insulating layer outside the first and second openings.

In order to produce more than three threshold voltage values, prior to the formation of the second mask, further masks are formed, structurings of the insulating layer are carried out and exposed aides are doped.

Since one of the threshold voltage values is set by way of the thickness of the structured insulating layer, the number of masks required for programming is smaller by one than the number of threshold voltage values.

The exposed aides are preferably doped by angled implantation. The implantation is preferably carried out at an angle of inclination is the range between 20° and 30° with respect to the normal to the main area. Angles of inclination of this type are provided as standard in many implantation installations is order to avoid the channeling effect.

As an alternative, the exposed sides are produced by outdiffusion of a doped layer. The doped layer is applied over the whole area above the structured insulating layer. The doped layer is preferably formed from doped glass, doped polysilicon or doped amorphous silicon. The use of doped glass has the advantage that the doped layer can in this case be removed selectively with respect to the substrate.

The insulating layer is preferably applied with a layer thickness such that it fills the trenches. The surface of the substrata is exposed prior to the formation of the first mask. The respective sides of the trenches are essentially completely exposed during the structuring of the insulating layer. A planar structure is obtained by the filling of the trenches. Focus problems are consequently avoided during the formation of the masks for the purpose of structuring the insulating layer. Furthermore, the variation in the individual threshold voltage values is reduced.

The trenches are preferably formed by anisotropic etching using a trench mask.

The strip-like, doped regions on the bottom of the trenches and on the main area between adjacent trenches are preferably produced by as implantation after the trench formation and after the removal of the trench mask. In this case, it is advantageous to provide the sides of the trenches with spacers prior to the implantation, which spacers have a masking action during the implantation. These spacers are subsequently removed. The formation of the trenches and of the strip-like, doped regions requires only one mask.

As an alternative, the strip-like, doped regions can be produced by producing A doped region on the main area, which doped region covers the entire memory cell array, before the formation of the trenches. When the trenches are opened, this doped region is subdivided into the strip-like, doped regions on the main area. The strip-like, doped regions on the bottom of the trenches are produced by ion implantation after the trenches have been opened. When using a trench mask, it is advantageous here to leave it as a mask on the main area during the implantation.

The insulating layer is preferably structured by anisotropic etching. However, the insulating layer can also be structured by combined isotropic and anisotropic etching. The etching takes place selectively with respect to the substrate.

BRIEF DESCRIPTION OF THE DRAWINGS

The invention is explained is more detail below using as exemplary embodiment and with reference to the figures.

The illustrations is the figures are not to scale.

DETAILED DESCRIPTION OF THE PREFERRED EMBODIMENTS

Figure 1:
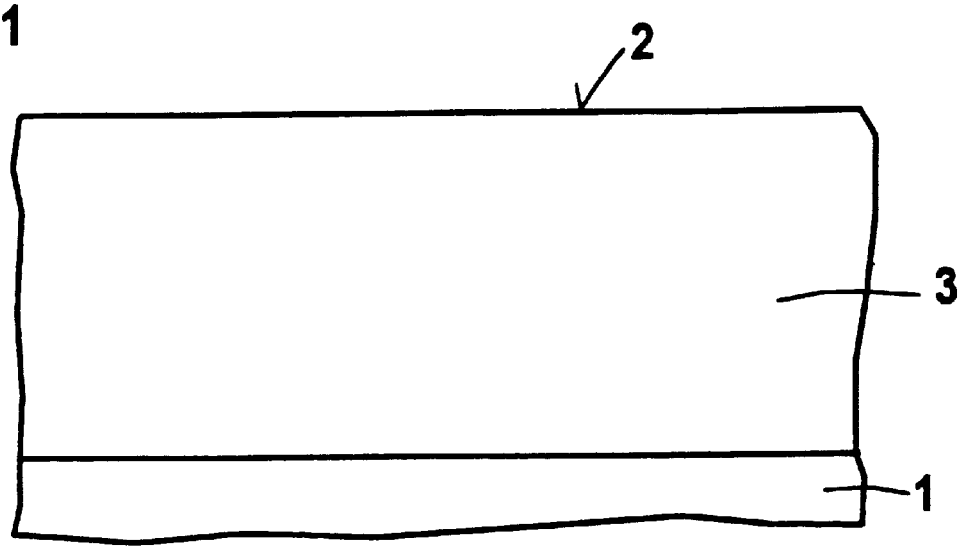
FIG. 1 is a side cross section which shows a substrate with a well which is doped by a first conductivity type.

In a substrate 1 made, for example, of p-doped monocrystalline silicon having a dopant concentration of $5\times10^{15}$ cm$^{-3}$, a p-doped well 3 having a dopant concentration of $2\times10^{17}$ cm$^{-3}$, is produced in a main area 2 by implantation and subsequent heat treatment (see FIG. 1). During the implantation of the p-doped well 3, use is made of a screen oxide with a thickness of, for example, 50 nm (not illustrated), which is removed again after the driving in of the p-doped well 3 at 180 keV, $7\times10^{12}$ cm$^{-2}$. The p-doped well 3 extends at least over a region for a cell array.

An SiO$_2$ layer is deposited on the main area 2 to a layer thickness of, for example, 300 nm for example using a TEOS method. The SiO$_2$ layer is structured with the aid of photolithographic process steps, a trench mask 4 being formed. The trench mask 4 has strip-like openings which essentially run in parallel. The strip-like openings in the trench mask 4 have a width of, for example, 0.4 μm, a length of, for example, 125 μm and a spacing of 0.4 μm.

Figure 2:
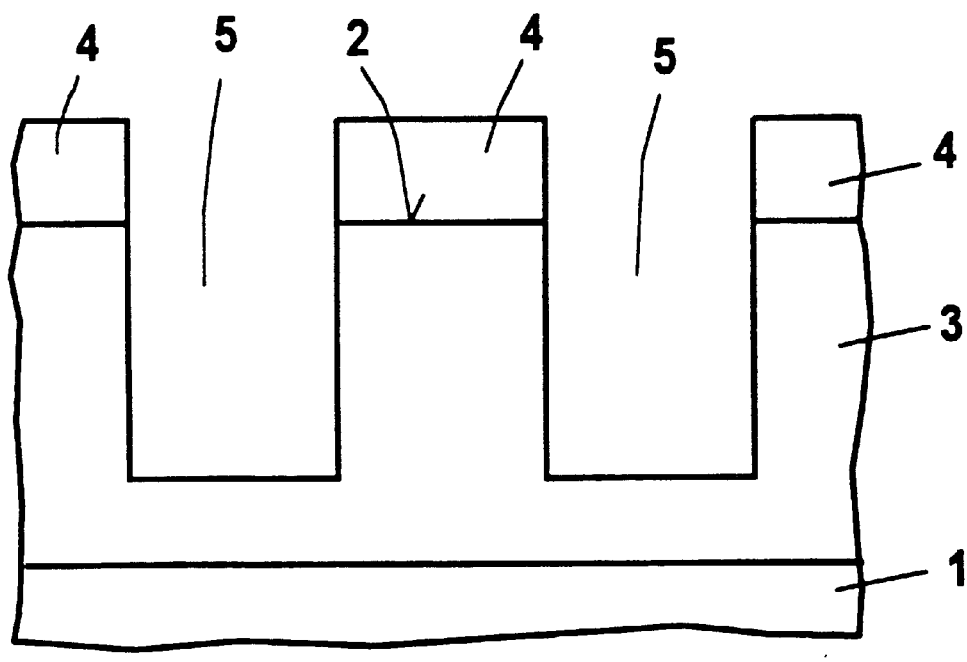
FIG. 2 shows the substrate of after the etching of strip-like trenches.

Trenches 5 are etched into the main area 2 of the substrate 1 is an anisotropic etching process, for example with HBr, He, O$_2$, NF$_3$, while using the trench mask 4 as an etching mask. The trenches 5 have a strip-like cross-section corresponding to the openings in the trench mask 4 parallel to the main area 2. They have a width of, for example, 0.4 μm a length of, for example, 125 μm and a spacing of, for example, 0.4 μm. The depth of the trenches is, for example, 0.6 μm (see FIG. 2). 32 parallel trenches 5 are formed, for example.

Figure 3:
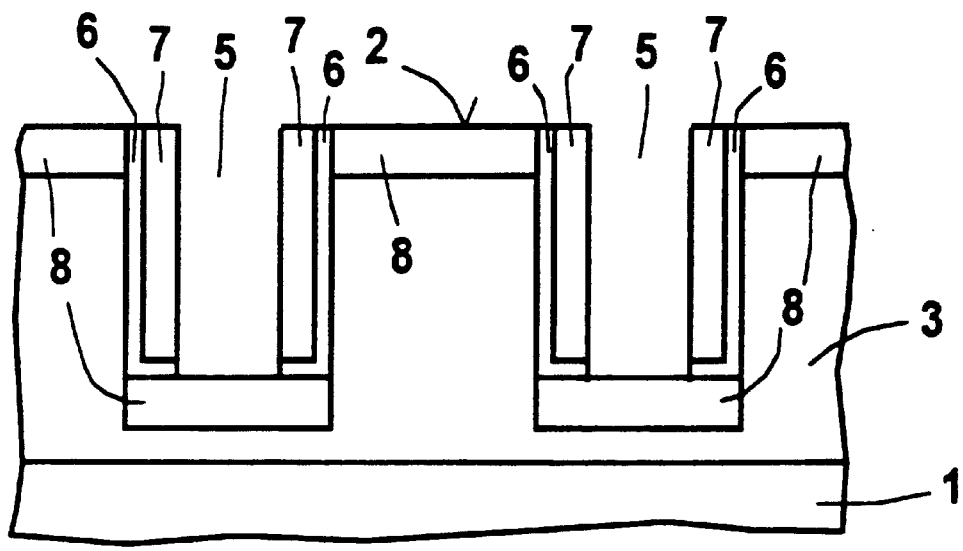
FIG. 3 shows the substrate after the formation of strip-like, doped regions on the bottoms of the trenches and between adjacent trenches on the main area.

The trench mask 4 is subsequently stripped off using an HF dip, for example. In order to improve the quality of the crystal surfaces, as SiO$_2$ layer 6 (so-called sacrificial oxide) is produced by thermal oxidation to a thickness of, for example, 20 nm (see FIG. 3). SiO$_2$ spacers 7 are produced on vertical sides of the trenches 5 by conformal deposition, for example using a TEOS method, of an SiO$_2$ layer to a layer thickness of, for example, 60 nm and subsequent anisotropic dry etching using CHF$_3$, O$_2$ (see FIG. 3). A thin screen oxide is subsequently deposited using a TEOS method (not illustrated). n⁺-doped, strip-like regions 8 are formed on the bottom of the trenches 5 and on the main area 2 between adjacent trenches 5 by means of implantation perpendicular to the main area 2 using As at a dose of $5 \times 10^{15}$ cm$^{-2}$ and as energy of 80 keV and a subsequent heat treatment step for dopant activation. A dopant concentration of, for example, $10^{21}$ cm$^{-3}$, is set is the strip-like, doped regions 8. The thin TEOS layer acts as a screen oxide during the implantation (not illustrated).

Figure 4:
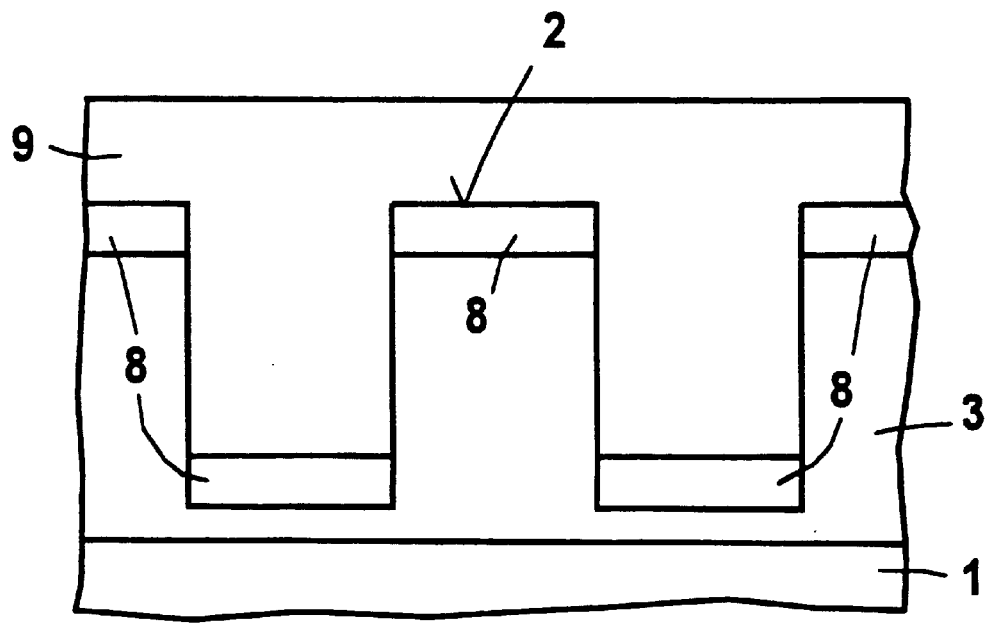
FIG. 4 shows the substrate after the application of an insulating layer.
Figure 5:
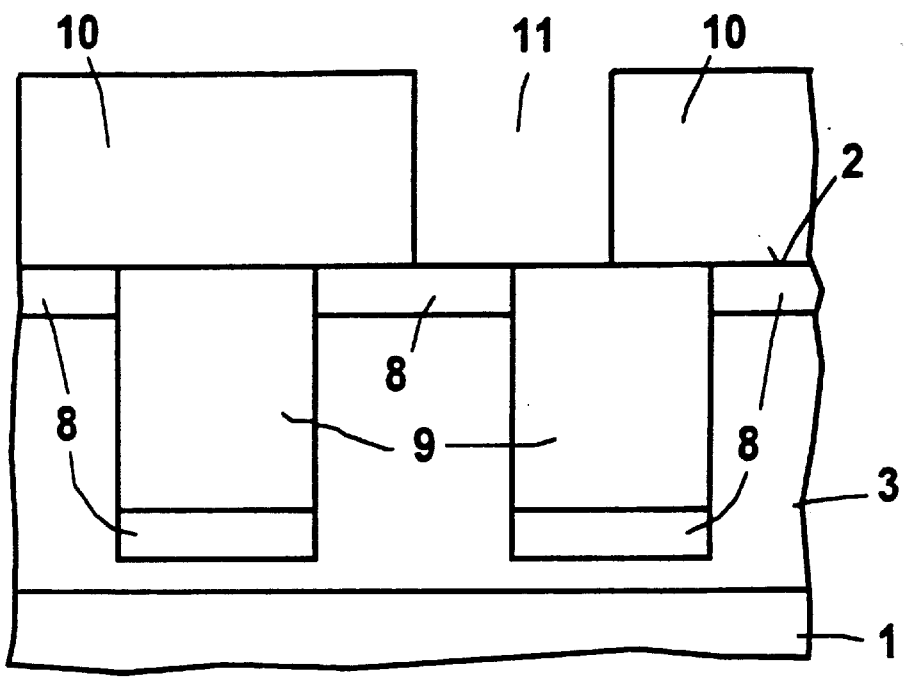
FIG. 5 shows the substrate after the exposure of the main area and the formation of a first mask.

The SiO$_2$ spacers 7 and the SiO$_2$ layer 6 are subsequently removed, for example by wet-chemical etching using as HF dip. As insulating layer 9 of SiO$_2$ is deposited, for example using a TEOS method. The insulating layer 9 is deposited to a layer thickness of 600 nm (see FIG. 4). This layer is etched back in a dry etching method using HBr, Cl$_2$, He, for example. The insulating layer 9 completely fills the trenches 5 (see FIG. 5).

A first mask 10 made, for example, of photoresist is subsequently formed using photolithographic process steps. The mask 10 has first openings 11 in the cell array. The region outside the cell array in which a periphery for the memory cell arrangement is formed, for example, is covered by the first mask 10. The first openings 11 are aligned in such a way that they each overlap at least one side of the trenches 5. The dimensions of the first openings 11 parallel to the main area 2 in each case correspond to the width of the trenches 5. Larger dimensions of the first openings 11 are achieved by the coincidence of adjacent openings. The first mask 10 is aligned is such a way that the first openings 11 are is each case arranged such that they overlap the aides of the trenches 5. If the trenches 5 are formed with a width corresponding to the minimum structure size F that can be produced with the respective technology and is, for example, 0.4 μm then the first openings 11 likewise have minimum dimensions of F×F. When aligning the first mask 10, use is made in this case of the fact that the alignment accuracy is in each case greater than the smallest structure size F that can be produced with the respective technology. In 0.4 μm technology, the alignment accuracy is, for example, F/3.

The insulating layer 9 is structured using as anisotropic etching method, for example with HBr, Cl$_2$, He. The first mask 10 acts as an etching mask in this case. In this process, the sides of the trenches 5 and the silicon surface on the bottoms of the trenches 5 and on the main area 2 between adjacent trenches 5 are exposed in the region of the first openings 11. Under the first mask 10, on the other hand, the insulating layer 9 is not attacked.

Figure 6:
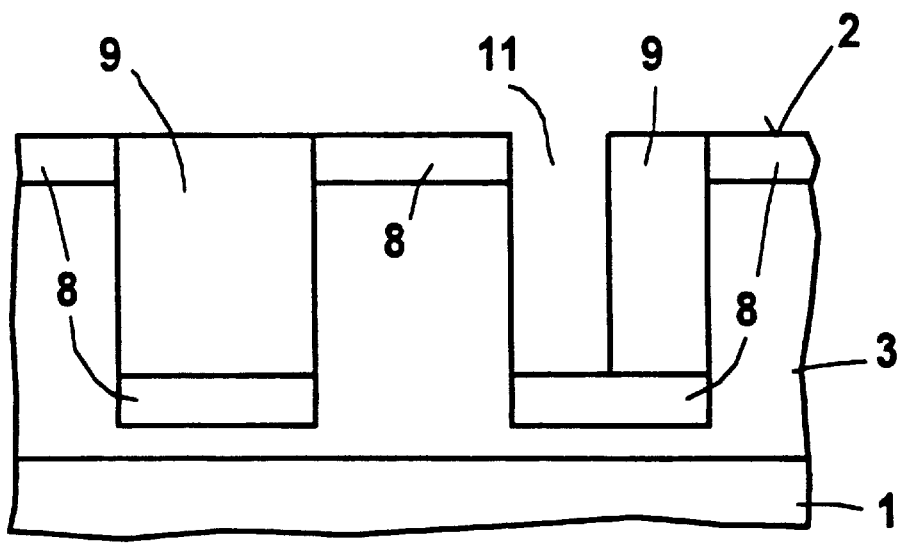
FIG. 6 shows the substrata after the first structuring of the insulating layer.

The mask 10 is removed after the structuring of the insulating layer 9 (see FIG. 6). A thin screen oxide (approximately 10 nm) is subsequently deposited using a TEOS method (not illustrated).

In a first implantation step, two angled implantations 20 are subsequently carried out using boron at a dose of, for example, $7 \cdot 10^{12}$ cm$^{-2}$ and as energy of, for example, 30 keV. In this case, the angle of inclination with respect to the normal to the main area 2 is 20° to 30°, and −20° to −30°. In the process, the exposed sides of the trenches 5 are doped at 21. A dopant concentration of, for example, $3 \cdot 10^{17}$ cm$^{-3}$ is set is the exposed sides. Since the doping in the strip-like, doped regions 8 is $10^{21}$ cm$^{-3}$, the implantation of boron can be tolerated is this region.

Figure 7:
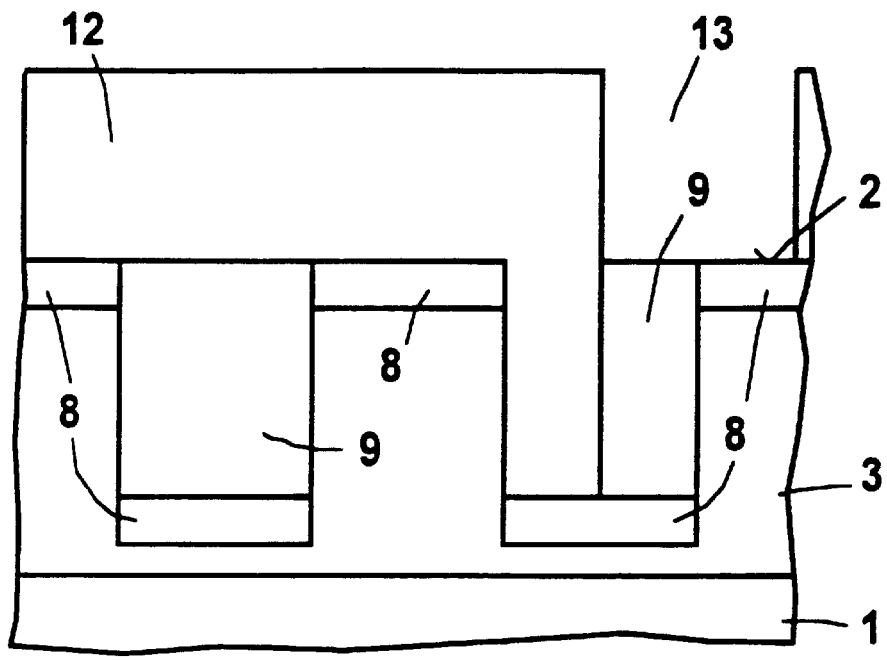
FIG. 7 shows the substrate after the formation of a second mask.

A second mask 12 made, for example, of photoresist is subsequently formed using photolithographic process steps (see FIG. 7). The second mask 12 has second openings 13 is the cell array. The region outside the cell array in which a periphery for the memory cell arrangement is formed, for example, is covered by the second mask 12. The second openings 13 are aligned in such a way that they each overlap at least one side of the trenches 5. The dimensions and the alignment of the second openings 13 correspond to those of the first openings 11.

The insulating layer 9 is structured using as anisotropic etching method, for example with HBr, Cl$_2$, He. The second mask 12 acts as an etching mask in this case. In the process, the aides of the trenches 5 and the silicon surface on the bottoms of the trenches 5 and on the main area 2 between the adjacent trenches 5 are exposed in the region of the second openings 13. Under the second mask 12, on the other hand, the insulating layer 9 is not attacked.

Figure 8:
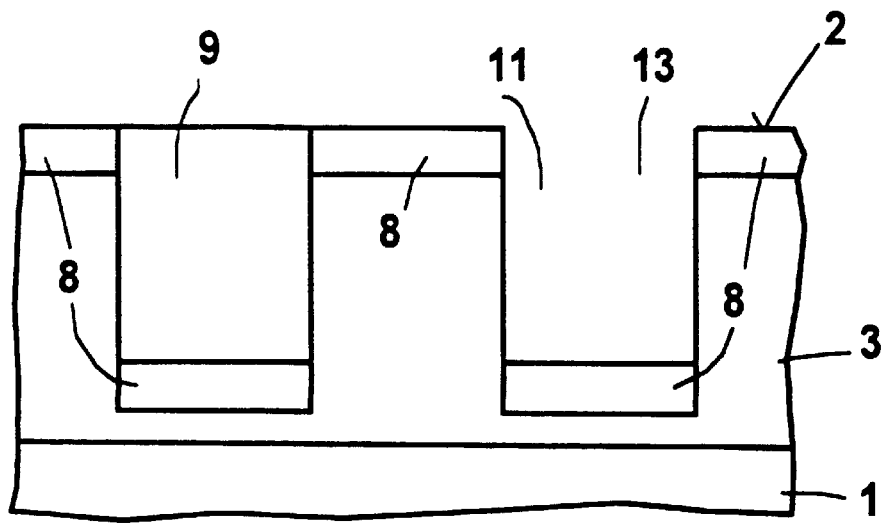
FIG. 8 shows the substrate after the second structuring of the insulating layer.

The second mask 12 is removed after the second structuring of the insulating layer 9 (see FIG. 8). A thin screen oxide (approximately 10 nm) is subsequently deposited using a TEOS method (not illustrated).

In a second implantation step, two angled implantations 22 are subsequently carried out using boron at a dose of, for example, $7 \cdot 10^{12}$ cm$^{-2}$ and as energy of, for example, 30 keV. In this case, the angle of inclination with respect to the normal to the main area 2 is 20° to 30°, and −20° to −30°. In the process, the exposed sides of the trenches 5 are doped at 21 and 23. A dopant concentration of, for example, $3 \cdot 10^{17}$ cm$^{-3}$ is set in the exposed sides in the region 23 of the second openings 13. In the region 21 of the first openings 11, the dopant concentration rises as a result of the second implantation step to, for example, $4 \cdot 10^{17}$ cm$^{-3}$. Since the doping is the strip-like, doped regions 8 is $10^{21}$ cm$^{-3}$, the implantation of boron can be tolerated in this region.

Figure 9:
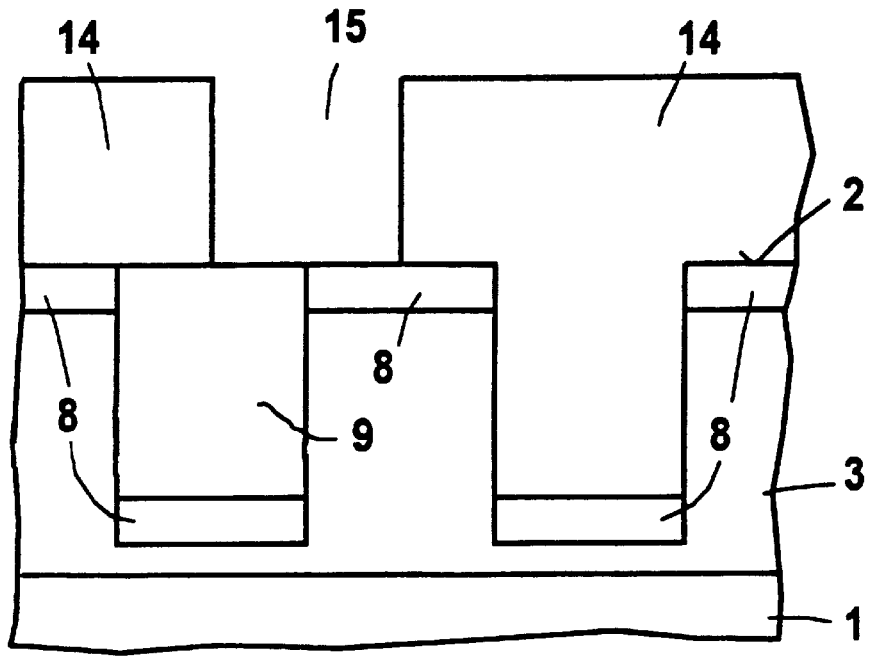
FIG. 9 shows the substrate after the formation of a third mask.

A third mask 14 made, for example, of photoresist is subsequently formed using photolithographic process steps (see FIG. 9). The third mask 14 has third openings 15 in the cell array. The region outside the cell array is which a periphery for the memory cell arrangement is formed, for example, is covered by the third mask 14. The third openings 15 are aligned is such a way that they each overlap at least one side of the trenches 5. The dimensions and the alignment of the third openings 15 correspond to those of the first openings 11 and of the second openings 13.

The insulating layer 9 is structured using an anisotropic etching method, for example with HBr, Cl$_2$, He. The third mask 14 acts as an etching mask in this case. In the process, the sides of the trenches 5 and the silicon surface on the bottoms of the trenches 5 and on the main area 2 between adjacent trenches 5 are exposed in the region of the third openings 15. Under the third mask 14, on the other head, the insulating layer is not attacked. Insulation structures 16 remain outside the regions of the first openings 11, of the second openings 13 and of the third openings 15, which insulation structures 15 have an extent corresponding to half the trench width perpendicularly to the aide on which they are arranged.

Figure 10:
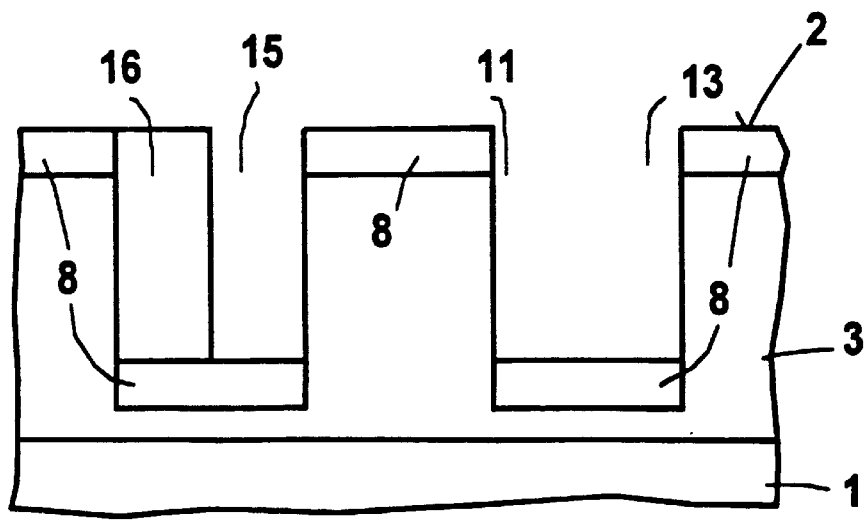
FIG. 10 shows the substrate after the third structuring of the insulating layer.
Figure 11:
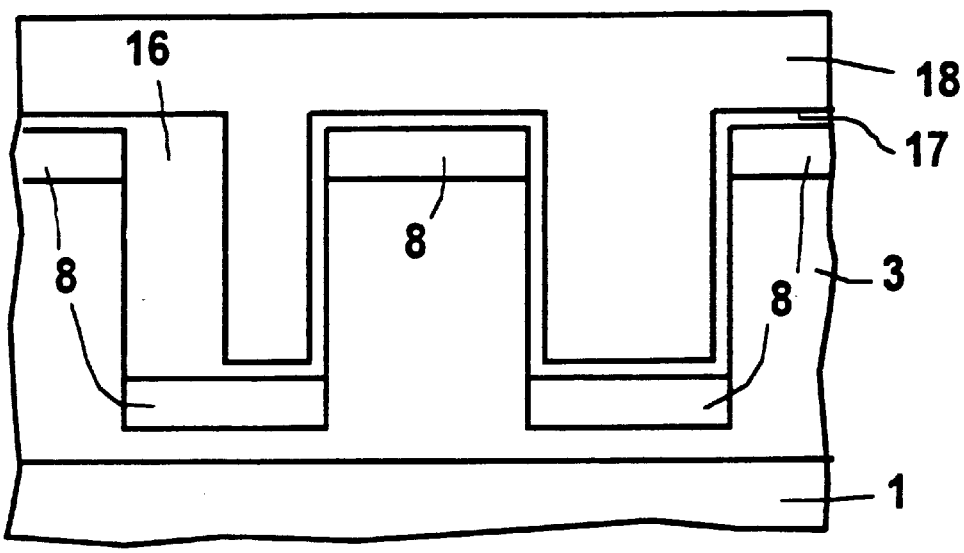
FIG. 11 shows the substrata after the formation of a gate dielectric and word lines which run transversely with respect to the trenches.

The third mask 14 removed after the third structuring of the insulating layer 9 (see FIG. 10). In the region of the third openings 15, the dopant concentration in the sides 24 of the trenches 5 remains at, for example, $2 \cdot 10^{17}$ cm$^{-3}$, The thin TEOS screen oxide is then removed using as HF dip. A gate dielectric 17 is produced on the exposed sides, for example by thermal oxidation, to a layer thickness of, for example, 10 nm (ass FIG. 11). An n⁺-doped polysilicon layer is subsequently applied over the whole area to a layer thickness of 400 nm. This is preferably done by the in situ-doped deposition of polysilicon. As an alternative, the polysilicon layer is deposited in undoped form and is subsequently doped by coating with a POCL layer (POCL stands for PCl₃: phosphorus chloride gas). The doped polysilicon layer is structured by anisotropic etching with the aid of photolithographic process steps. This produces word lines 18 which run transversely with respect to the trenches 5 (see FIG. 11 and FIG. 12). The word lines 18 have a width of, for example, F=0.4 μm. The spacing between adjacent word lines 18 is likewise F.

The vertical MOS transistors are in each case formed by two strip-like doped regions 8 which adjoin the same side of one of the trenches 5, that part of the well 3 which is arranged is between as channel region, the gate dielectric 17 or the insulation structure 16 and the adjoining part of one of the word lines 18.

The four vertical MOS transistors have four different threshold voltage values. A first threshold voltage value at 25 is determined by the thickness of the insulation structure 16 which acts as gate dielectric of a thick oxide transistor. A second threshold voltage value is determined by the dopant concentration at 21 established by the first and the second implantation step. A third threshold voltage value is determined by the dopant concentration established by the second implantation step. A fourth threshold voltage value is determined by the dopant concentration of the well 3 at 23.

The memory cell arrangement is therefore programmed during the structuring of the insulating layer 9. The information is transmitted into the memory cell arrangement via the arrangement of the first openings 11, of the second openings 13 and of the third openings 15 in the respective masks 10, 12, 14.

The extent of the vertical MOS transistor parallel to the course of the strip-like trenches 5 is given by the width of the word lines 18. MOS transistors which are adjacent along one side of one of the trenches are separated from one another by the spacing between adjacent word lines 18. The strip-like, doped regions 8 in each case run over the entire cell array. They form lines which, depending on the interconnection, are used as a bit lice or reference lice and interconnect the source/drain regions of MOS transistors which are adjacent along a trench.

As an alternative to the first and second implantation steps, the exposed sides of the trenches 5 are formed by outdiffusion from a doped layer. For this purpose, the first mask 10 and second mask 12 are removed and then a doped layer made, for example, of borosilicate glass is deposited to a layer thickness of 50 nm over the whole area (not illustrated). The sides are doped by outdiffusion in a heat treatment step at, for example, 900°. Prior to the formation of the second mask 12 and of the third mask 14, the doped layer is in each case removed, for example, using as HF dip.

For the purpose of reading out the memory cells, the strip-like, doped regions 8 are used as a bit or reference line. The memory call to be assessed is selected via the word line. During read-out, the threshold voltage of the respective MOS transistor is assessed.

Figure 12:
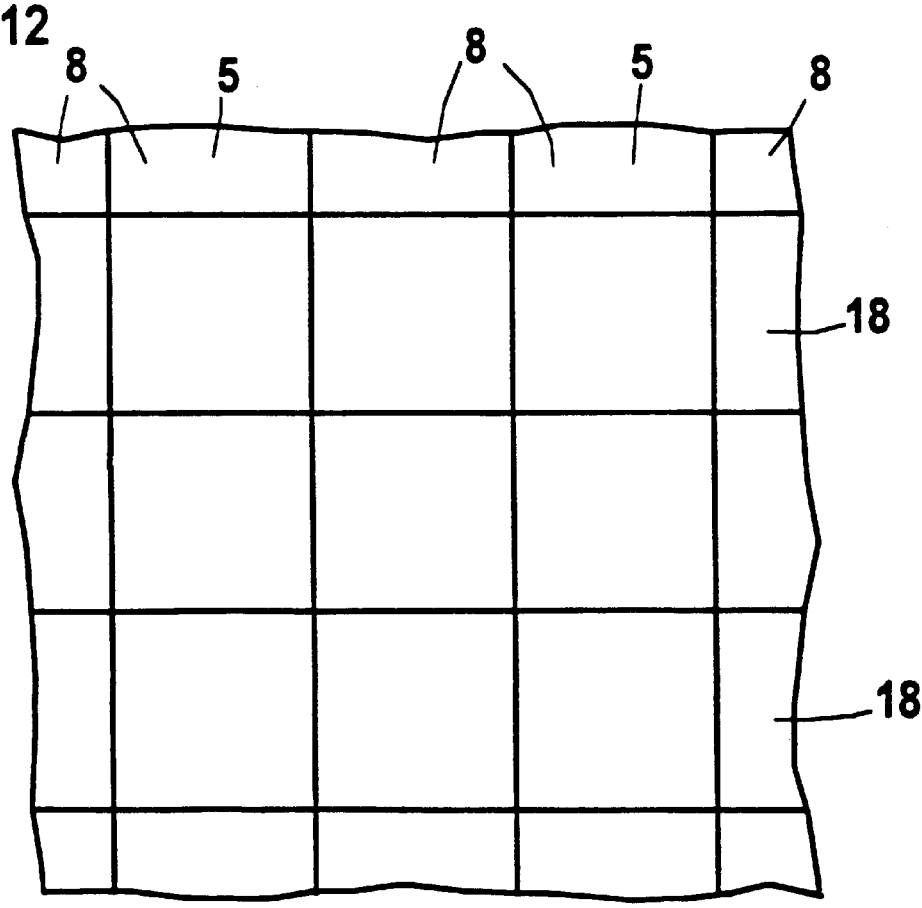
FIG. 12 shows a play view of the substrate after formation of the word lines.

FIG. 12 illustrates a plan view of the memory cell arrangement. The course of the word lines 18 transversely with respect to the trenches 5 is shown. Also depicted are the strip-like, doped regions 8, which run on the bottom of the trenches 5 and between adjacent trenches 5.

Each memory cell comprises a vertical MOS transistor which has an extent of 2 F parallel to the course of the strip-like trenches 5 and as extent of F perpendicular to the course of the strip-like trenches 5. The space requirement for each memory cell is therefore 2 F².

The production of the memory cell arrangement is concluded by the deposition of an intermediate dielectric, the opening of contact holes and the production of a metallization layer (not illustrated).

Although other modifications and changes may be suggested by those skilled in the art, it is the intention of the inventors to embody within the patent warranted hereon all changes and modifications as reasonably and properly come within the scope of their contribution to the art.

What is claimed is:

1. A method for production of a memory cell arrangement, comprising the steps of:
    forming strip-like trenches which essentially run in parallel in a main area of a substrate which includes at least in a region of the main area semiconductor material which is doped by a first conductivity type,
    forming MOS transistors which are vertical with respect to the main area of the substrate, the MOS transistors being formed on the sides of the trenches, said MOS transistors functioning as memory cells and have respective first, second and third threshold voltage values depending upon stored information of the respective MOS transistors, and
    a first memory cell of said memory cells possessing said first threshold voltage value depending upon a thickness of a gate dielectric which differs from a gate dielectric thickness of said MOS transistors not having said first threshold value, a second memory cell of said memory cells having said second threshold voltage value depending upon a second gate dielectric thickness and a channel doping, a third memory cell of said memory cells having said third threshold voltage value depending upon a different channel doping than said channel doping of said second memory cell.

2. A method according to claim 1, further comprising the steps of:
    forming strip-like doped regions doped by a second conductivity type opposite to the first on a bottom of the trenches and on the main area between adjacent trenches,
    applying an insulating layer,
    producing a first mask which has first openings on the insulating layer,
    patterning the insulating layer by anisotropic etching using a first mask in such a way that the sides of trenches are at least partially exposed in the region of the finer openings,
    doping exposed sides of the trenches,
    producing a second mask which has second openings on the insulating layer,
    patterning the insulating layer by anisotropic etching using the second mask in such a way that the sides of trenches are at least partially exposed in the region of the second openings,
    forming a gate dielectric on the sides of the trenches, and
    forming word lines which run transversely with respect to the trenches.

3. A method according to claim 2, further comprising the steps of:
    filling the trenches with the insulating layer,
    substantially completely exposing the sides of the trenches in a region of the first and of the second openings.

4. A method according to claim 2, wherein the sides are doped by angled implantation.

5. A method according to claim 4, wherein said angled implantation is carried out at any angle of inclination in at least one of a range between 20° and 30° and a range between −20° and −30° with respect to a normal to the main area.

6. A method according to claim 2, wherein the sides are doped by diffusion.

7. A method according to claim 1, further comprising the steps of:

providing the trenches with spacers, forming the strip-like doped regions by implantation in which the spacers on the sides of the trenches have a masking action, and removing the spacers after the formation of the strip-like, doped regions.

* * * * *